United States Patent
Spreadbury

[19]

[11] Patent Number: 5,987,485
[45] Date of Patent: *Nov. 16, 1999

[54] ADAPTIVE DIGITAL FILTER

[75] Inventor: David John Spreadbury, Harston, United Kingdom

[73] Assignee: Ionica International Limited, Cambridge, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/809,132

[22] PCT Filed: Sep. 8, 1995

[86] PCT No.: PCT/GB95/02122

§ 371 Date: May 28, 1997

§ 102(e) Date: May 28, 1997

[87] PCT Pub. No.: WO96/08867

PCT Pub. Date: Mar. 21, 1996

[30] Foreign Application Priority Data

Sep. 16, 1994 [GB] United Kingdom ............... 9418755

[51] Int. Cl.[6] .................................................. G06F 17/10
[52] U.S. Cl. ................................................ 708/322
[58] Field of Search ........................... 364/724.19, 724.2; 708/322, 323

[56] References Cited

U.S. PATENT DOCUMENTS

| | | | |
|---|---|---|---|
| 4,349,889 | 9/1982 | Elzen et al. ................. | 364/724.19 |
| 5,168,459 | 12/1992 | Hiller ............................. | 364/724.19 |
| 5,216,629 | 6/1993 | Gurcan et al. ................ | 364/724.19 |
| 5,243,624 | 9/1993 | Paik et al. .................... | 364/724.19 |
| 5,282,155 | 1/1994 | Jones ............................. | 364/724.19 |
| 5,295,192 | 3/1994 | Hamada et al. .............. | 381/71 |
| 5,303,173 | 4/1994 | Mori et al. .................... | 364/724.19 |
| 5,315,621 | 5/1994 | Lucioni ......................... | 364/724.19 |
| 5,392,315 | 2/1995 | Laud ............................. | 364/724.19 |
| 5,535,150 | 7/1996 | Chiang .......................... | 364/724.19 |

FOREIGN PATENT DOCUMENTS 0 373 468  6/1990  European Pat. Off. ....... H03H 17/02

OTHER PUBLICATIONS

Jin Yun Zhang et al, "Realization and Implementation of Adaptive State–Space Recursive Filters", pp. 956–959, IEEE, 1989.

*Primary Examiner*—David H. Malzahn
*Attorney, Agent, or Firm*—Fish & Richardson P.C.

[57] ABSTRACT

In adaptive digital filtering, first steps of adapting a filter coefficient dependent on a received data sample, and second steps of filtering by applying an adapted filter coefficient to a received data sample, are alternated so that adapted filter coefficients and modulated data samples are alternatively determined. In consequence, each adapted filter coefficient can be provided for immediate use in filtering.

12 Claims, 1 Drawing Sheet

ADAPTIVE DIGITAL FILTER

The present invention relates to adaptive digital filters, in particular for use in radio receivers.

Conventional adaptive digital filters are known, for example, from digital signal processing by E C Ifeachor and D W Jervis, 1993 Addison-Wesley Publishers Limited. These filters suffer the disadvantage that filter coefficients are all updated and stored before use in modulating received data samples. This procedure necessarily involves writing the coefficients to memory and reading all the coefficients from memory before filtering. This makes the adaptive filter relatively slow, or requires additional circuitry for the separate up-dating of coefficients.

The present invention is defined in the claims to which reference should now be made.

The present invention provides a method of adaptive digital filtering comprising first steps each of adapting a filter coefficient dependent on a received data sample, and second steps each of applying an adapted filter coefficient to a received data sample, in which the first and second steps are timed such that adapted filter coefficients and modulated data samples are alternatively determined. In consequence, each adapted filter coefficient can be provided for immediate use in filtering without needing to be held in a memory.

Coefficients are adapted according to an error derived from a previous filtering operation for use in the next filtering operation. Each filtering operation is on successively later received data samples.

The present invention also provides an adaptive digital filter comprising filter means and adaptive means, the adaptive means being operative to adapt a filter coefficient to provide an adapted coefficient, the filter means being operative to apply an adaptive filter coefficient to a received data sample, the operation of the filter means and adaptive means being timed such that adaptive filter coefficients and modulated data samples are alternately provided. In this way, an adapted filter coefficient may be read into the filter means one clock cycle after having been determined. An adapted filter coefficient can, at a predetermined time, both be read by the filter means and written to a memory for later use.

The present invention also provides a receiver including a novel adaptive digital filter as outlined above. The receiver could be for radio or telecommunications, in particular for time division multiplex (TDM) and/or Time division multiple access (TDMA) communications. The receiver can be a base station receiving TDMA communications from subscriber units which can be at fixed locations.

The present invention also relates to corresponding methods of radio reception.

The present invention preferably provides the advantage of increased data throughput through simple adaptive digital filters.

A preferred embodiment of the present invention will now be described by way of example and with reference to the drawings in which.

Figure 1:
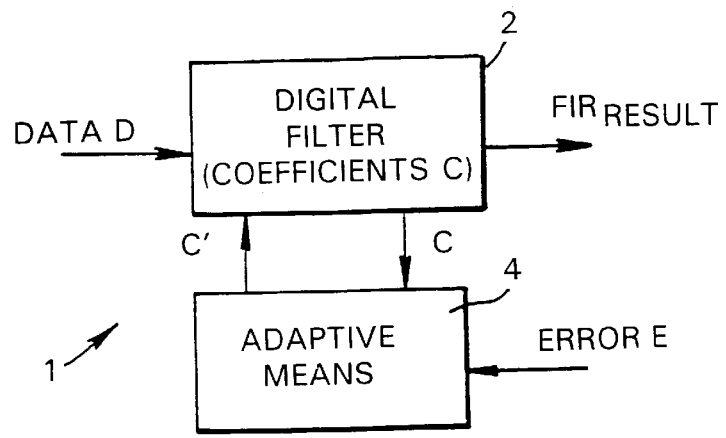
FIG. 1 is a simple block diagram illustrating an adaptive filter.

As shown in FIG. 1, an adaptive filter 1 comprises a digital filter 2 connected with adaptive means 4. Data samples D are received and applied to the digital filter 2 and a filtered output signal $FIR_{result}$ is provided. The previous filter coefficients $C_n$ applied by the filter 2 are adapted, i.e. updated, dependent on an error E which is the difference between received and expected filter outputs $FIR_{result}$ to provide adapted filter coefficients $C_n'$. These adapted coefficients $C_n'$ are applied to filter out any systematic errors received in data samples D. The filter 2, which is a multi-tap (e.g. 8-tap) filter, acts to provide an output $FIR_{result}$ according to the equation $$FIR_{result} = \sum_{n=0}^{n=7} C_n' D_{N+n+2} \qquad \text{(Equation 1)}$$

where $C_n'$ are the updated filter coefficients and $D_{N+n+2}$ are the data samples, N denoting the first data sample in the combined adaption and filtering process.

The filter acts in response to a complex error signal E where the error E is deduced as follows:

$$E = K.(FIR_{result} - \text{Expected Result}) \qquad \text{(Equation 2)},$$

where K is a positive constant set to control the speed of adaptation.

The error E is used to update the filter coefficients in adaptive means 4 according to the LMS algorithm, specifically equation:

$$C_n' = C_n - E.D^*_{N+n} \quad 0 \leq n \leq 7 \qquad \text{(Equation 3)},$$

where $D_{N+n}^*$ is the complex conjugate of $D_{N+n}$.

The adaptive means 4 of the adaptive filter 1 thus acts to alter the filter coefficients to bring the expected and received filter outputs $FIR_{result}$ into agreement.

The interleaving of filtering (Equation 1) and adapting (Equation 2) operations allows each coefficient to be adapted according to the error derived from a previous filtering operation before use in the current filter operation.

For an adapting and filtering operation where initialisation is required, the adaptive operation becomes, in place of Equation 3, $$C_n' = 0 \text{ for } 0 \leq n \leq 7.$$

Figure 2:
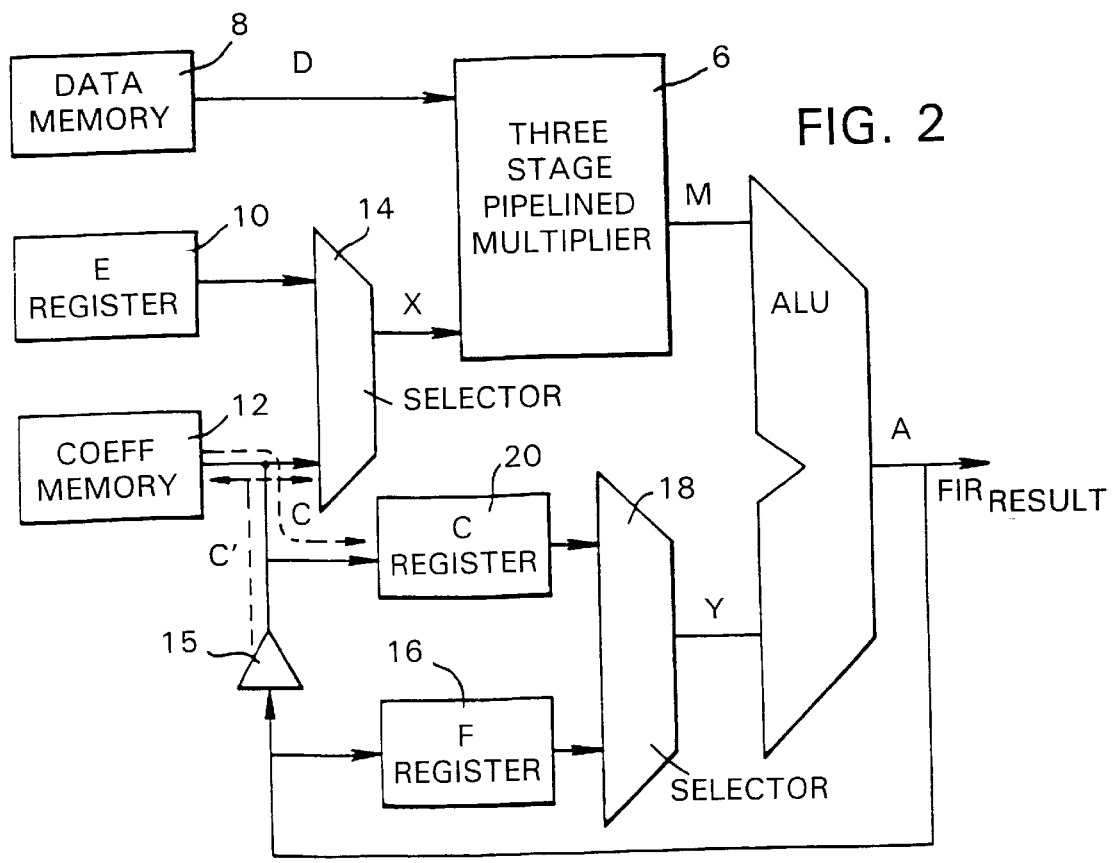
FIG. 2 is a block diagram of an adaptive filter according to the present invention.

The apparatus of the adaptive filter 1 is shown in more detail in FIG. 2. There is a complex multiplier 6 which receives data samples D from a data memory 8 and selectively receives, from a selector 14 having an output signal denoted X, either an error value E from an error register 10 or a filter coefficient $C_n$ from a control buffer 15. The multiplier 6 is connected to an arithmetic logic unit ALU to which it provides a signal M. The arithmetic logic unit ALU provides an output signal A, and performs the calculations necessary to provide filter data samples F and coefficient $C_n'$, as described below.

The modulated data samples F are fed back to a register 16 which is connected to a selector 18. The other input port of the selector 18 is connected to a register 20 for holding a filter coefficient C. The output port of the selector 18 is connected to the arithmetic unit ALU, and the arithmetic logic unit ALU output is connected via the control buffer 15, to the coefficient memory 12 and selector 14 to both of which it delivers the updated filter coefficient C'. Selector 18 provides a signal Y to the arithmetic logic unit ALU.

The sequence of operations undertaken by the adaptive filter 1 is shown in Table 1, which details the individual operation of the data memory 8, coefficient memory 12, multiplier 6, ALU, and selectors 14 and 18, and the values of the data within the circuit. for each time step throughout a complete adaption and filtering operation.

As shown in Table 1, the first data sample $D_{N+0}$ and the error value E are provided to the multiplier 6 at the time step 1. The multiplier 6 operates to provide an output signal M of $E.D^*_{N+O}$ which, because of the multiplier's three stage pipeline appears 3 time steps later, at time step 4. At time step 3, $C_O$ is read from the coefficient memory 12 into the C register 20, becoming available to the ALU through selector 18 at time step 4. The arithmetic logic unit ALU acts to provide an output A of $C_O-E.D^*_{N+O}$ in time step 4. This is passed to $C_O'$ both to the coefficient memory 12 and, through selector 14, to the multiplier 6. This completes the adaptation of the first filter coefficient.

Also at time step 4, $D_{N+2}$ is provided to the multiplier 6 from the data memory 8. The multiplier 6 operates to provide an output M of $C_O'.D_{N+2}$ 3 time steps later, at time step 7. The ALU passes this unchanged to the F-register 16, completing the modulation of the first data sample in the filter.

The above sequence of operations, in which $C_n'$ and $C_n'.D_{N+n+2}$ are computed from E, $D_N$, $C_n$ and $D_{N+n+2}$, for the case n=O, is repeated for n=1 to 7 inclusive, starting at time steps 3,5,7,9,11,13 and 15 respectively. For these sequences, however, the operation of the ALU during the filtering (data modulating) phase (at time steps 9,11,13,15,17,19 and 21) is modified to produce a result A of $F+C_n'.D_{N+n+2}$, thus causing this result to include the sum of all previously modulated data, as required by Equation 1.

These repeated sequences are interleaved cooperatively, causing the multiplier and ALU to operate on updated coefficients $C_n'$ and modulated data samples alternatively, in such a way as to ensure that the updated coefficients are provided for immediate use without needing to be written to and subsequently read from a memory.

timing the steps of adapting and filtering such that the adapted filter coefficient and the modulated data sample are alternatively determined in a arithmetic logic unit.

2. A method of adaptive digital filtering according to claim 1, further comprising the step of:
providing the adapted filter coefficient for immediate use in filtering without the adapted filter coefficient being held in memory.

3. A method of adaptive digital filtering according to claim 1, in which the filtering step comprises the step of:
filtering according to the equation:

$$FIR_{result} = \sum_{n=0}^{n=7} C_n' D_{N+n+2}$$

where $C_n'$ are the adapted filter coefficients and $D_{N+n+2}$ are the data samples, N denoting the first data sample in the combined adaption and filtering process.

4. A method of adaptive digital filtering according to claim 1, wherein the adapting step further comprises of step of:
using an error derived from a previous filtering operation to adapt a filter coefficient for use in the next filtering operation.

5. A method of adaptive digital filtering according to claim 4, in which the step of using an error comprises the step of deriving an error E according to the equation:

$$E=K.(FIR_{result}-\text{Expected Result})$$

where K is a positive constant set to control the speed of adaptation, and in which method, the step of adapting the

TABLE 1

| TIME STEP | COEFF MEMORY FN | D | X | MULTIPLIER FN | M | C | Y | ALU FN | A | DEST |
|---|---|---|---|---|---|---|---|---|---|---|
| 1 | | $D_{N+0}$ | E | M=X.D* | $E.D^*_{N+0}$ | $C_0$ | $C_0$ | Y-M | $C_0-E.D^*_{D+0}$ | $C'_0$ |
| 2 | | | | | | | | | | |
| 3 | READ $C_0$ | $D_{N+1}$ | E | M=X.D* | $E.D^*_{N+1}$ | $C_1$ | $X_1$ | Y-M | $C_1-E.D^*_{N+1}$ | $C'_1$ |
| 4 | WRITE $C'_0$ | $N_{N+2}$ | $C'_0$ | M=X.D | $C'_0.D_{N+2}$ | | | M | $C'_0.D_{N+2}$ | F |
| 5 | READ $C_1$ | $D_{N+2}$ | E | M=X.D* | $E.D^*_{N+2}$ | $C_2$ | $C_2$ | Y-M | $C_2-E.D^*_{N+2}$ | $C'_2$ |
| 6 | WRITE $C'_1$ | $D_{N+3}$ | $C'_1$ | M=X.D | $C'_1.D_{N+3}$ | | F | Y+M | $C'_0.D_{N+2}+C'_1.D_{N+3}$ | F |
| 7 | READ $C_2$ | $N_{N+3}$ | E | M=X.D* | $E.D^*_{N+3}$ | $C_3$ | $C_3$ | Y-M | $C_3-E.D^*_{N+3}$ | $C'_3$ |
| 8 | WRITE $C'_2$ | $D_{N+4}$ | $C'_2$ | M=X.D | $C'_2.D_{N+4}$ | | F | Y+M | $C'_0.D_{N+2}+C'_1.D_{N+3}+C'_2.D_{N+1}$ | F |
| 9 | READ $C_3$ | $D_{N+4}$ | E | M=X.D* | $E.D^*_{N+4}$ | $C_4$ | $C_1$ | Y-M | $C_1-E.D^*_{N+4}$ | $C'_4$ |
| 10 | WRITE $C'_3$ | $D_{N+5}$ | $C'_3$ | M=X.D | $C'_3.D_{N+5}$ | | F | Y+M | $C'_0.D_{N+2}+C'_1.D_{N+3}+C'_2.D_{N'4}+C'_3.D_{N+5}$ | F |
| 11 | READ $C_4$ | $N_{N+5}$ | E | M=X.D* | $E.D^*_{N+5}$ | $C_5$ | $C_5$ | Y-M | $C_4-E.D^*_{N+5}$ | $C'_5$ |
| 12 | WRITE C'4 | $D_{N+6}$ | $C'_4$ | M=X.D | $C'_4.D_{N+6}$ | | F | Y+M | $C'_0.D_{N+2}+C'_1.D_{N+3}+C'_2.D_{N+4}+C'_3.D_{N+5}+C'_4.D_{N+6}$ | F |
| 13 | READ $C_5$ | $D_{N+6}$ | E | M=X.D* | $E.D^*_{N+6}$ | $C_6$ | $C_6$ | Y-M | $C_0-E.D^*_{N+6}$ | $C'_6$ |
| 14 | WRITE $C'_5$ | $D_{N+7}$ | $C'_5$ | M=X.D | $C'_5.D_{N+7}$ | | F | Y+M | $C'_0.D_{N+2}+C'_1.D_{N+3}+C'_2.D_{N+4}+C'_3.D_{N+5}+C'_4.D_{N+6}+C'_5.D_{N+7}$ | F |
| 15 | READ $C_6$ | $D_{N+7}$ | E | M=X.D* | $E.D^*_{N+7}$ | $C_7$ | $C_7$ | Y-M | $C_7-E.D^*_{N+7}$ | $C'_7$ |
| 16 | WRITE $C'_6$ | $D_{N+8}$ | $C'_8$ | M=X.D | $C'_6.D_{N+8}$ | | F | Y+M | $C'_0.D_{N+2}+C'_1.D_{N+3}+C'_2.D_{N+4}+C'_3.D_{N+5}+C'_4.D_{N+6}+C'_5.D_{N+7}+C'_8.D_{N+8}$ | F |
| 17 | READ $C_7$ | $N_{N+8}$ | | | | | | | | |
| 18 | WRITE $C'_7$ | $D_{N+9}$ | $C'_7$ | M=X.D | $C'_7.D_{N+8}$ | | F | Y+M | $C'_0.D_{N+2}+C'_1.D_{N+3}+C'_2.D_{N+4}+C'_3.D_{N+5}+C'_4.D_{N+6}+C'_5.D_{N+7}+C'_8.D_{N+8}+C'_7.D_{N+9}$ | FIResult |
| 19 | | | | | | | | | | |
| 20 | | | | | | | | | | |
| 21 | | | | | | | | | | |

I claim:

1. A method of adaptive digital filtering comprising the steps of:
   adapting a filter coefficient dependent on a received data sample,
   filtering by applying the adapted filter coefficient to a later received data sample to generate a modulated data sample, and filter coefficient comprises the step of adapting the filter coefficient according to the equation:

$$C_n'=C_n-E.D^*_{N+n}, \ 0 \leq n \leq 7$$

where $D_{N+n}^*$ is the complex conjugate of $D_{N+n}$.

6. A method of radio or telecommunications reception comprising the step of adaptive digital filtering by steps of:

adapting a filter coefficient dependent on a received data sample, filtering by applying the adapted filter coefficient to a later received data sample to generate a modulated data sample, and timing the steps of adapting and filtering such that the adapted filter coefficient and the modulated data sample are alternatively determined in an arithmetic logic unit.

7. An adaptive digital filter comprising:

an arithmetic logic unit operative to adapt a filter coefficient dependent on a received data sample and to generate a modulated data sample by applying the adapted filter coefficient to a later received data sample, and a timing device operative to control the arithmetic logic unit to alternatively provide the adapted filter coefficient and the modulated data sample.

8. An adaptive digital filter according to claim 7, wherein the timing device comprises means operative to produce clock cycles to control the operation of the arithmetic logic unit and the adaptive digital filter further comprises means operative to provide the adapted filter coefficient for use for filtering during the same clock cycle during which the adapted filter coefficient is produced.

9. An adaptive digital filter according to claim 8, further comprising means operative to read the adapted filter coefficient into the arithmetic logic unit for filtering one clock cycle after the adapted filter coefficient is generated.

10. An adaptive digital filter according to claim 7, further comprising a memory and means operative to, at a predetermined time, both supply the adapted filter coefficient to the arithmetic logic unit for the filtering operation and write the adapted filter coefficient to the memory for later use.

11. An adaptive digital filter according to claim 7, further comprising means operative to provide an error derived from a previous filtering operation to the arithmetic logic unit to adapt a filter coefficient for use in the next filtering operation.

12. A receiver for radio or telecommunications comprising:

an adaptive digital filter which comprises:
an arithmetic logic unit operative to adapt a filter coefficient dependent on a received data sample and to generate a modulated data sample by applying the adapted filter coefficient to a later received data sample, and
a timing device operative to control the arithmetic logic unit to alternatively provide the adapted filter coefficient and the modulated data sample.

* * * * *